United States Patent [19]

Min et al.

[11] Patent Number: 5,130,580

[45] Date of Patent: Jul. 14, 1992

[54] SENSE AMPLIFIER DRIVING CIRCUIT EMPLOYING CURRENT MIRROR FOR SEMICONDUCTOR MEMORY DEVICE

[75] Inventors: Dong-sun Min, Seoul; Hong-sun Hwang, Taegu-si; Soo-in Cho; Dae-Je Chin, both of Seoul, all of Rep. of Korea

[73] Assignee: Samsung Electronic Co., Ltd., Kyunggi, Rep. of Korea

[21] Appl. No.: 550,997

[22] Filed: Jul. 11, 1990

[30] Foreign Application Priority Data

May 23, 1990 [KR] Rep. of Korea .................. 90-7388

[51] Int. Cl.$^5$ ................. H03F 3/45; H03K 19/094
[52] U.S. Cl. ................. 307/530; 307/451; 307/546; 307/290; 330/253; 330/257
[58] Field of Search ............... 307/443, 448, 451, 530, 307/546, 290; 330/253, 257

[56] References Cited

U.S. PATENT DOCUMENTS 4,888,503 12/1989 Young ........................... 307/530

Primary Examiner—Stanley D. Miller
Assistant Examiner—Margaret Rose Wambach
Attorney, Agent, or Firm—Cushman, Darby & Cushman

[57] ABSTRACT

A sense amplifier driving circuit for controlling sense amplifiers of high density semiconductor memory device by turning-on/off a driving transistor connected between an external voltage Vcc terminal and a ground voltage Vss terminal, comprises a bias circuit including a MOS transistor being connected to the driving MOS transistor to form a current mirror circuit therewith which is controlled by a sense amplifier enable clock and a constant current source having a MOS transistor with a bias voltage of an intermediate level between Vcc and Vss being applied to its gate terminal. The bias circuit is connected to the gate terminal of the driving transistor to control the gate voltage of the driving transistor, thereby reducing the peak current of a sense amplifier driving signal. Further, the driving signals are generated in the waveform having a linear dual slope, resulting in a decrease in power-noise. The bias circuit is connected to a clamping circuit having a comparator circuit to clamp the active restore voltage of the sense amplifier driving circuit, so that the active restore voltage can be maintained at the level of an internal voltage (approximately 4V), thereby preventing the distortion of the characteristics of the cell device and eliminating the necessity of additional standby current by enabling the sense amplifier only for the active restore operation. Further, the sense amplifier driving circuit comprises a constant circuit including two or more current mirror circuits which are sequentially activated, whereby the sense amplifier driving signals are made to have stable linear dual slopes.

17 Claims, 12 Drawing Sheets

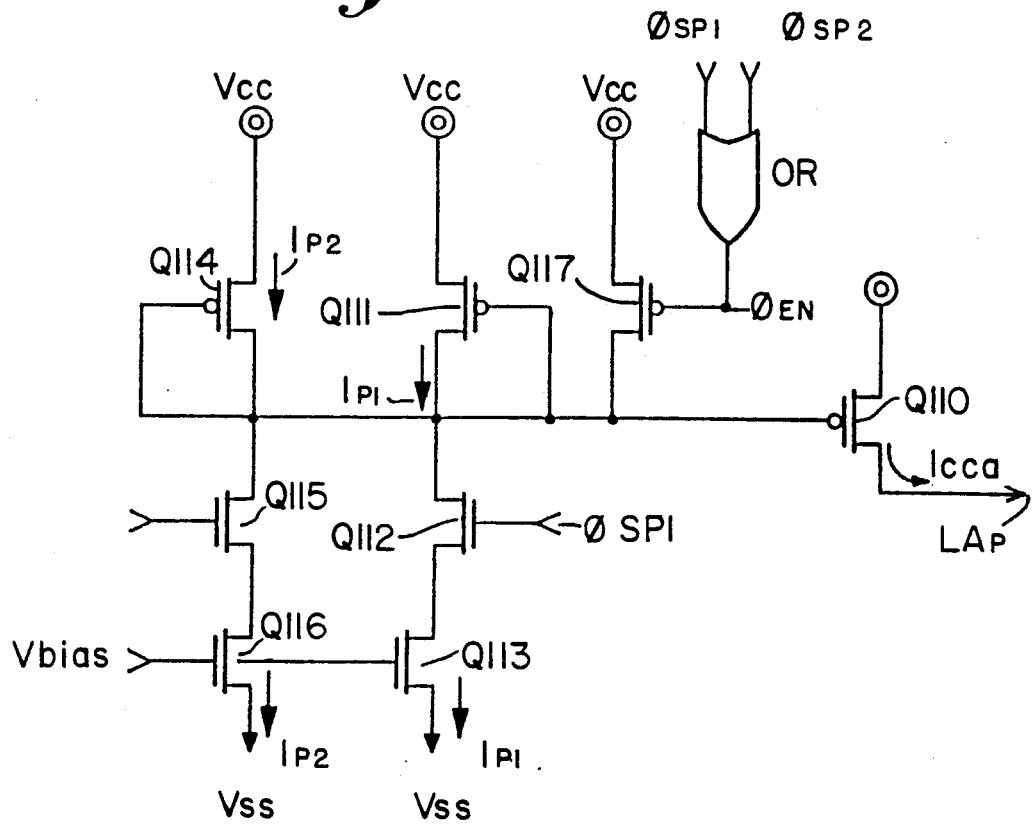
Fig.9.
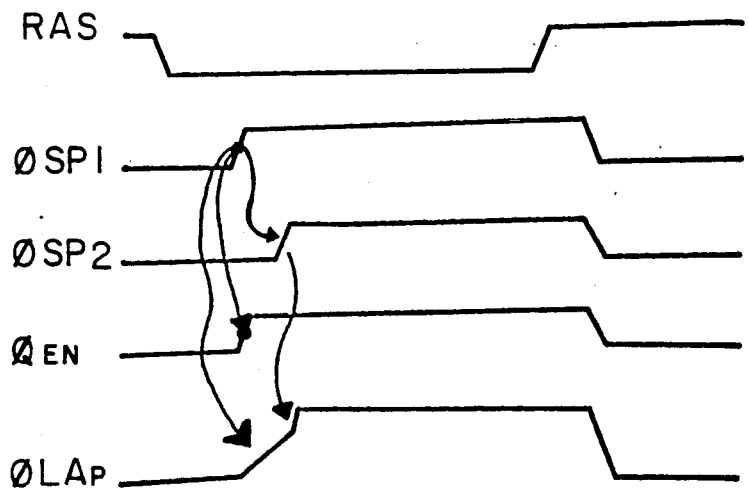

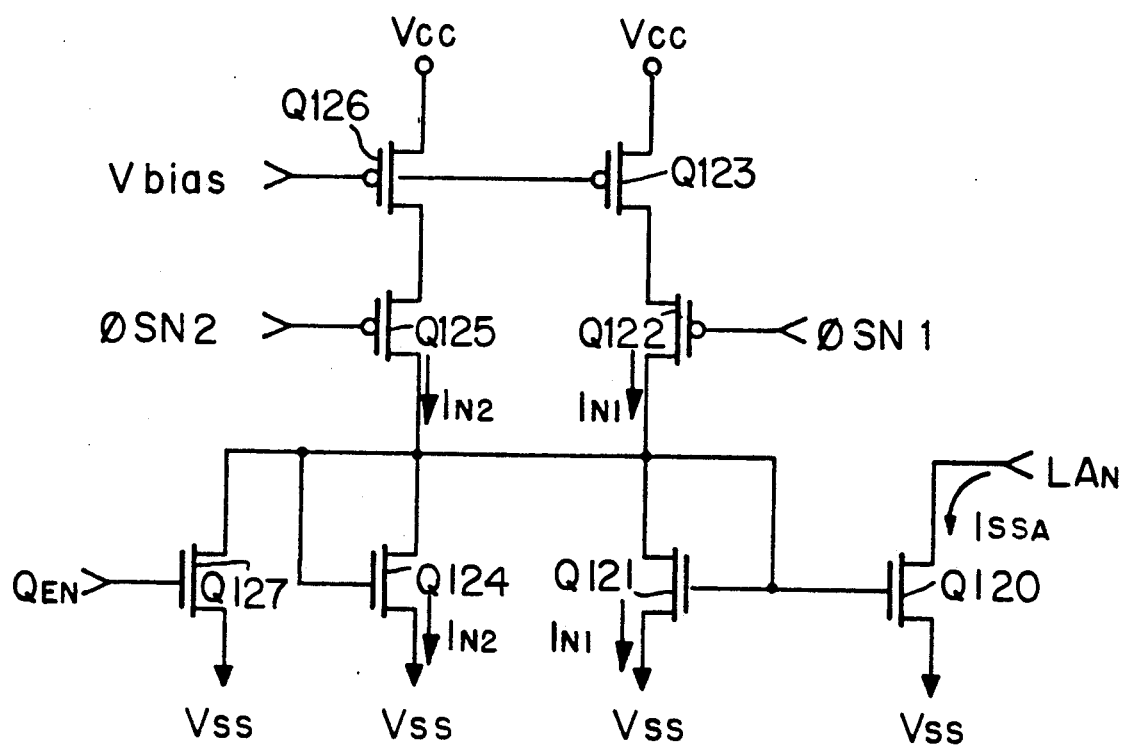
*Fig. 10.*
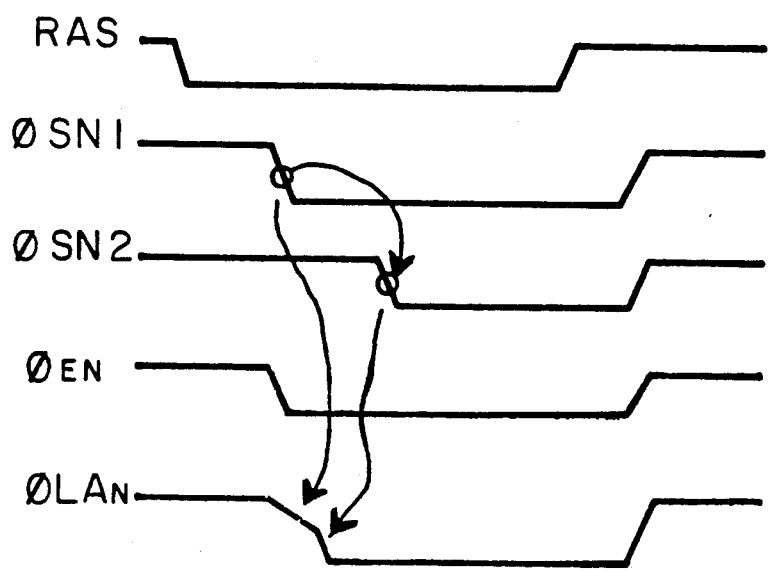

SENSE AMPLIFIER DRIVING CIRCUIT EMPLOYING CURRENT MIRROR FOR SEMICONDUCTOR MEMORY DEVICE

FIELD OF THE INVENTION

The present invention relates to a sense amplifier driving circuit for amplifying the data stored in memory cells of a high density memory device, and particularly to a sense amplifier driving circuit in which the peak current encountered during the driving of the sense amplifier of the memory device is decreased, so that the stability of the sense amplifier is improved, the signals for driving the sense amplifier will have dual slopes, and the active restore voltage inputted into the latch node of a P-MOS sense amplifier will be clamped to an internal voltage level.

BACKGROUND OF THE INVENTION

Recently, many different kinds of semiconductor memory devices, have been developed and in all of these memory devices, sense amplifiers for amplifying the data stored in the memory cells are used. However, as the density of the semiconductor memory device increases the peak current of the sense amplifier driving signals also increases to a high level, and the stability of the sense amplifier deteriorates during the driving of the sense amplifier. Therefore, efforts have been made in order to reduce the peak current of the sense amplifier driving signals, to reduce the noise caused thereby, and to increase the stability of the sense amplifier.

FIG. 1A (Prior Art) illustrates the conventional sense amplifier and a driving circuit therefore, both of which are used generally. As shown, this conventional sense amplifier comprises two P-MOS transistors connected to a latch node $LA_P$, two N-MOS transistors connected to a latch node $LA_N$, and bit lines $BL_L$, $BL_R$ connected to the gate terminals of the MOS transistors.

The sense amplifier driving circuit includes a large sized P-MOS transistor Q1 and a large sized N-MOS transistor Q2 for driving the sense amplifiers. Both MOS transistors are respectively connected to the latch nodes $LA_P$, $LA_N$, and also respectively connected to an external voltage Vcc terminal and to a ground potential Vss terminal. The sense driving circuit also includes inverters INV1, INV2 respectively connected to the gate terminals of the MOS transistors Q1, Q2.

The operation of conventional sense amplifier driving circuit as described above will now be explained with references to FIG. 2. During the active restore operations of the sense amplifier, if a row address strobe signal RAS goes low, then an active restore enable signal $\phi_{SP}$ becomes high. This signal is inverted to a low level by the inverter INV1, and the inverted signal is inputed to the gate terminal of the driving transistor Q1 to turn on the transistor Q1.

In a similar way, during the sensing operation of the N-MOS sense amplifier, if the row address strobe signal RAS goes to a low level, then a sensing enable signal $\phi_{SN}$ becomes low. This signal is inverted to a high level by the inverter INV2, and the inverted signal is inputted into the gate terminal of the transistor Q2 to turn on the transistor Q2.

Thus, the conventional sense amplifiers are controlled by the turning-on/off operations of the driving MOS transistors Q1, Q2.

However, when the driving MOS transistors Q1 and Q2 are turned on, peak currents Iccp and Issp are generated and suddenly increased, thereby producing the large power noises. Further, the potentials of the common latch nodes $LA_P$, $LA_N$ for the sense amplifiers varies in a steep form as shown by the wave forms of the driving signals $\phi LA_P$, $\phi LA_N$ in FIG. 2 (Prior Art), and therefore, the stability of the micro-sized sense amplifiers deteriorates further.

In order to improve the stability of the sense amplifier, the conventional sense amplifier driving circuit can be constructed such that dual sensing strobe signals are inputted through sequential operations of two or more transistors. However, in such cases a large number of involved transistors make the controlling very complicated and difficult.

In order to overcome the above described disadvantages, the MOS transistors Q1, Q2 for driving the sense amplifiers $SA_1$-$SA_N$ can be divided into smaller transistors. These divided MOS transistors can then be connected to the respective sense amplifiers, as illustrated in FIG. 1B (Prior Art).

However, this causes, the parasitic capacitance of the nodes $LA_P$, $LA_N$ to be increased due to a large number of sense amplifiers, and consequently, the sensing speed is slowed down. Furthermore the lay-out of the circuitry and the forming of the dual sensing slopes become difficult. The sense amplifier driving circuit illustrated in FIG. 1B is similar to that of FIG. 1A, except that a plurality of driving transistors $Q1_1$-$Q1n$ $Q2_1$-$Q2n$ are respectively connected to the sense amplifiers $SA_1$-$SA_N$. That is, the sense amplifier driving P-MOS transistors $Q1_1$-$Q1n$ and the sense amplifier driving N-MOS transistors $Q2_1$-$Q2n$ which are disposed in a distributed manner are connected between the common latch nodes $LA_P$, $LA_N$ and the terminals Vcc, Vss respectively.

Upon the driving operations of the sense amplifiers, if the row address strobe signal RAS of FIG. 2 (Prior Art) goes to a low level, the P-MOS transistors $Q1_1$-$Q1n$ and the N-MOS transistors $Q2_1$-$Q2n$ are turned on/off by the active restore enable signals $\phi_{SP}$ and the sensing enable signals $\phi_{SN1}$ which have been inverted by the inverters INV1 and INV2.

Upon driving the sense amplifiers, the transistors $Q1_1$-$Q1n$ or $Q2_1$-$Q2n$ are simultaneously turned-on so as to produce suddenly increasing peak currents, and therefore, the potentials of the latch nodes $LA_P$, $LA_N$ are suddenly varied, decreasing the stability of the micro-sized sense amplifiers.

Further, since the sense amplifier driving transistors are disposed in a distributed manner within the memory cell array, it is difficult for this system to adopt the sensing scheme with the driving signal having the dual slope, due to a difficulty of the lay-out of circuitry and an increase of chip area. As shown by the timing diagram (FIG. 2 (Prior Art)) for the conventional sense amplifier driving circuit, the peak values of driving signal currents Icc and Iss are very large, and the voltage variations of the driving signals $\phi LA_P$ and $\phi LA_N$ are very steep.

As described above, the conventional sense amplifier driving circuit has disadvantages such that, during the driving operation of the sense amplifiers, and particularly, upon the turning-on of the driving transistors, the peak current values of the driving signals $\phi LA_P$ and $\phi LA_N$ become very large, the variations of the driving voltages become very rapid, and the sensing speed thereof becomes very slow due to the increase of the parasitic capacitance, for such amplifiers the lay-out of the circuitry becomes difficult, and the formation of the dual sensing slope becomes also difficult.

SUMMARY OF THE INVENTION

The present invention is intended to overcome the above described disadvantages of the conventional circuit.

Therefore, it is an object of the present invention to provide a sense amplifier driving circuit in which the voltages of the gate terminals of the driving transistors are controlled during the operation of the transistors by a bias circuit. The bias circuit includes MOS transistors forming a mirror circuit together with the driving transistor, so that the driving transistor can be slowly turned on, and so that the driving signals $\phi LA_P$ and $\phi LA_N$ can respectively have linear rising or falling slopes, thereby decreasing the peak currents of the driving signals, and improving the stability of the micro-sized sense amplifiers.

It is another object of the present invention to provide a sense amplifier driving circuit in which, during the active restore driving of the sense amplifiers, the external voltage Vcc for the memory cell arrays is clamped to an internal level (approximately 4V), so that the deteriorations of the characteristics of the signal cell device can be prevented.

It is still another object of the present invention to provide a sense amplifier driving circuit which is enabled only during the active restore mode, thereby removing an additional stand-by current which can occur because of the use of an internal voltage generating circuit in the conventional technique.

It is still another object of the present invention to provide a sense amplifier driving circuit in which two current mirror circuits are formed. They are to be driven in a sequential manner, so that the sense amplifier driving signals have dual linear slopes, thereby making it possible to drive the sense amplifiers rapidly and stably.

In order to achieve the above objects, according to an embodiment of the present invention, a sense amplifier driving circuit for driving a plurality of sense amplifiers includes two P-MOS transistors and two N-MOS transistors, including an active restore driving circuit for receiving active restore enable signal $\phi_{SP}$ through its input terminal and producing an active restore driving signal $\phi LA_P$. The active restore driving circuit is connected between said sense amplifiers and the power source terminal Vcc. The driving circuit also includes a sensing driving circuit for receiving sensing enable signals $\phi_{SN}$ through its input terminal and producing a sensing driving signal $\phi LA_N$. The sensing driving circuit is connected between the sense amplifiers and the ground terminals Vss.

The active restore driving circuit includes:
a current mirror circuit. The current minor circuit is made of P-MOS transistors. The restore driving circuit also includes an inverter circuit for controlling the operations of the current mirror circuit in accordance with the active restore enable signals $\phi_{SP}$. The inverter circuit is composed of a P-MOS transistor and an N-MOS transistor.

An N-MOS transistor serves as a constant current source for said current mirror circuit and receives a bias voltage Vbi as through its gate terminal. The drain terminal of the N-MOS is connected to a source terminal of the N-MOS transistor, and a source terminal is connected to the ground terminal Vss with.

The above described construction allows the potential of the active restore driving signals $\phi LA_P$ to be controlled so that the waveform of the signal $\phi LA_P$ has a linear rising slope.

The other part of the driving circuit, the said sensing driving circuit includes:
a current mirror circuit. This is constructed by one or greater number of driving N-MOS transistors and another N-MOS transistor for adjusting the current flow amount of the driving transistors.

The sensing driving circuit also includes an inverter circuit for controlling the operations of the current mirror circuit in accordance with the sensing enable signals $\phi_{SN}$. The inverter circuit includes an N-MOS transistors and a P-MOS transistor.

A P-MOS transistor serves as a constant current source for the current mirror circuit and receives a bias voltage Vbias through its gate terminal. Its source terminal is connected to a drain terminal of the P-MOS transistor of the inverter circuit, and a drain terminal is connected to an external power source terminal Vcc.

The above described design enables the potential of the sensing driving signals $\phi LA_N$ to be controlled so that the waveform of the signal $\phi LA_N$ has a linear falling slope.

According to another embodiment of the present invention, a sense amplifier driving circuit for driving a plurality of sense amplifiers includes an active restore driving circuit composed of one or many driving P-MOS transistors connected between the sense amplifiers and the external power source terminal Vcc.

The sense amplifier driving circuit includes:
a bias circuit for adjusting the current flow rate of the driving P-MOS transistor consisting of a P-MOS transistor for forming a current mirror circuit together with the driving P-MOS transistor. The P-MOS transistor is connected to the gate terminal of said driving P-MOS transistor.

The circuit further includes for controlling the operations of the current mirror circuit in accordance with the active restore enable signal $\phi_{SP}$. The inverter itself is composed of a P-MOS transistor and an N-MOS transistor. An N-MOS transistor serves as a constant current source for the current mirror circuit and receives a bias voltage Vbias through its gate terminal. Its drain terminal is connected to the source terminal of the N-MOS transistor of the inverter circuit, and a source terminal is connected to a ground terminal;

Another component of the sense amplifying driving circuit is a comparator circuit for detecting the voltage $V_{LAP}$ of the latch nodes of the sense amplifiers and for comparing the detected result with a reference voltage $V_{REF}$. The comparator circuit consists of a differential amplifier circuit and a constant current source.

In addition, the driving circuit employs a trigger circuit for triggering the bias circuit to a high or low state in order to activate or turn off the bias circuit in response to the outputs of the comparator circuit.

Various components just described operate together to clamp, the active restore voltage to an internal voltage of a constant level (approximately 4 V) regardless of the externally supplied voltage.

According to still another embodiment of the present invention, there is provided a sense amplifier driving circuit includes an active restore driving circuit which is provided with a plurality of driving P-MOS transistors connected between an external voltage terminal Vcc and the sense amplifiers.

The sense amplifier driving circuit includes:

a P-MOS transistor which forms a current mirror circuit together with the driving transistor to adjust the current flow rate of the driving transistor and of which gate and source terminals are connected to gate terminal of the driving transistor.

The sense amplifier also includes a N-MOS transistor, of which drain terminal is connected to the gate terminal of the driving transistor and to source terminal of the P-MOS transistor and of which receives a active restore enable clock $\phi_{SP1}$ through its gate terminal.

Another component of the present embodiment is a first constant current source for serving as a constant current source for the current mirror circuit. The first constant current source consists of another N-MOS transistor which receives a bias voltage Vbias through its gate terminal and whose drain terminal is connected to the source terminal of the N-MOS transistor;

Also included is a second P-MOS transistor which forms another current mirror circuit together with the driving transistor and of which gate and source terminals are connected to the gate terminal of the driving transistor;

Yet another component of the present embodiment is a second N-MOS transistor whose drain terminal is connected to the gate terminal of the driving transistor and to source terminal of the P-MOS transistor and which receives a second active restore enable clock signal $\phi_{SP2}$ into its gate terminal Yet another component of the present device a second constant current source for serving as a constant current source for the second current mirror circuit.

The second constant current source consisting of an N-MOS transistor which receives the bias voltage Vbias through its gate terminal and of which drain terminal is connected to source terminal of the second N-MOS transistor.

An OR gate receiver first and second active restore enable signals $\phi_{SP1}$, $\phi_{SP2}$ and outputs a driving control clock $\phi_{EN}$. The OR gate is connected through yet another P-MOS transistor to the gate terminal of the driving transistor.

In the present circuit the first and second current mirror circuits are activated sequentially so that an active restore driving signal $\phi LA_P$ has a linear dual slope.

According to still another embodiment of the present invention, a sense amplifier driving circuit includes a sensing driving circuit which is provided with one or a plurality of driving N-MOS transistors connected between the sense amplifiers and a ground terminal Vss.

The sense amplifier driving circuit includes:

a first N-MOS transistor which forms a first current mirror circuit together with the driving transistor to adjust the current flow rate of the driving transistor and whose gate and drain terminals are connected to the gate terminal of the driving N-MOS transistor.

The circuit also includes a first P-MOS transistor of which source terminal is connected to gate terminal of the driving transistor and to drain terminal of the first N-MOS transistor and which receives a first sensing enable signal $\phi_{SN1}$ through its gate terminal.

Another component of the sensing driving circuit is a first constant current source for serving as a constant current source for the first current mirror circuit, the first constant current source consisting of a third P-MOS transistor which receives a bias voltage and of which source terminal is connected to drain terminal of the P-MOS transistor.

Yet another component of the sensing driving circuit is a second N-MOS transistor which forms a second current mirror circuit together with the driving transistor and whose gate and drain terminals are connected to the gate terminal of the driving N-MOS transistor.

A second P-MOS transistor of which source terminal is connected to the gate terminal of the driving transistor and to drain terminal of said second N-MOS transistor receives a second sensing enable clock $\phi_{SN2}$.

A second constant current source serves as a constant current source for the second current mirror circuit, said second constant current source consisting of yet another P-MOS transistor which receives a bias voltage Vbias through its gate terminal. Its source terminal is connected to drain terminal of the second P-MOS transistor.

The present embodiment includes a third N-MOS transistor, which receives a driving control clock $\phi_{EN}$, and of which source terminal is grounded and drain terminal is connected to gate terminal of the driving transistor.

In this embodiment the first and second current mirror circuits are activated sequentially so that a sensing driving signals $\phi LA_N$ has a linear dual slope.

BRIEF DESCRIPTION OF THE DRAWINGS

The above objects and other advantages of the present invention will become more apparent from reading the following description preferred embodiment of the present invention, with reference to the attached drawings in which:

FIG. 9 is a circuital illustration and a timing chart of the third embodiment of the sense amplifier driving circuit according to the present invention, in which a dual slope characteristic is shown during the operation of active restore; and FIG. 10 is a circuital illustration and a timing chart of the fourth embodiment of the sense amplifier driving circuit according to the present invention, in which a dual sensing slope characteristic is shown.

DESCRIPTION OF THE PREFERRED EMBODIMENTS

Figure 3A:
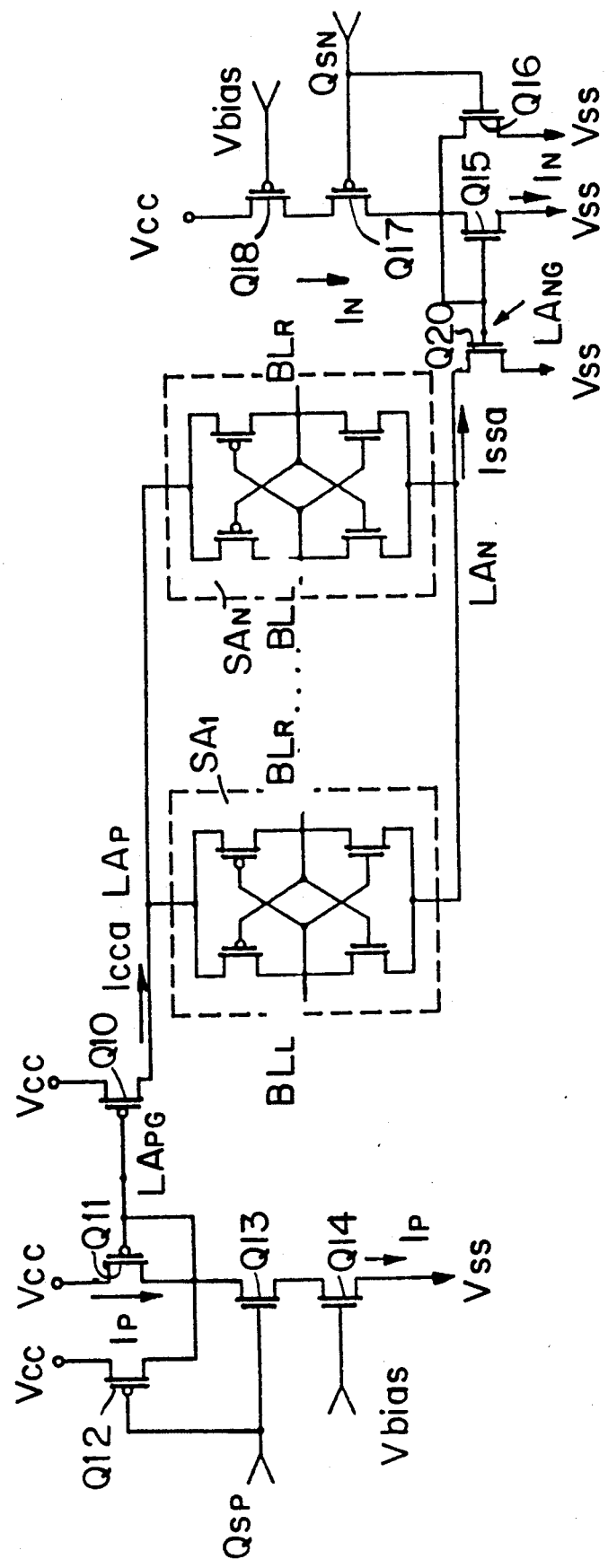
FIGS. 3A and 3B are circuital illustrations of the first embodiment of the sense amplifier driving circuit according to the present invention.
Figure 3B:
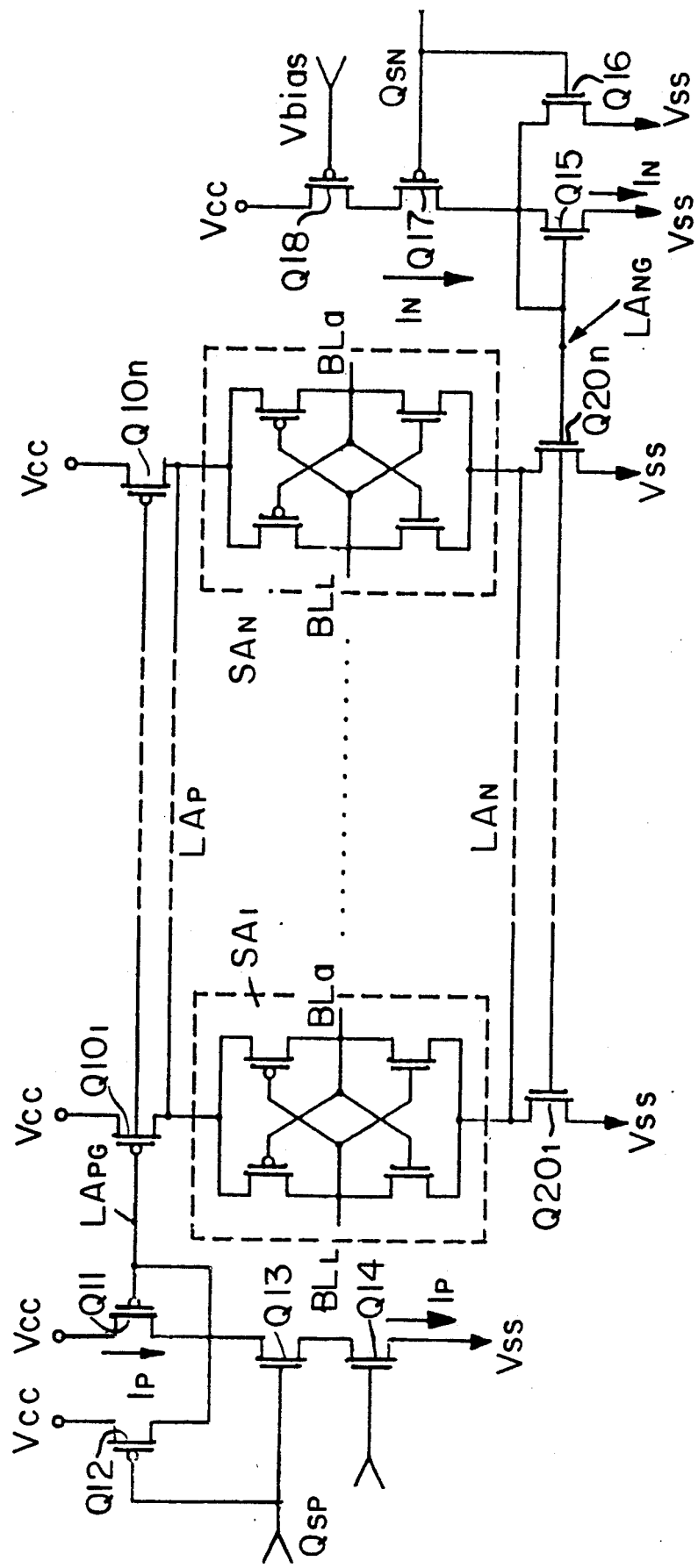

Referring to FIG. 3A and 3B, the first embodiment of the sense amplifier driving circuit according to the present invention will be described.

According to FIG. 3A, a large P-MOS transistor Q10 and a large N-MOS transistor Q20 are respectively connected to the latch nodes $LA_P$, $LA_N$ of N sense amplifiers $SA_1$–$SA_N$. According to FIG. 3B, the circuit is the same as that of FIG. 3A, except that a P-MOS transistors $Q10_1$–$Q10_n$ and N-MOS transistors $Q20_1$–$Q20_n$ are provided (instead of a single P-MOS transistor and a single N-MOS transistor in FIG. 3A). They are connected in a distributed manner through the latch nodes $LA_P$, $LA_N$ of the N sense amplifiers $SA_1$–$SA_N$, respectively.

In the circuits of FIGS. 3A and 3B, each of the sense amplifiers $SA_1$–$SA_N$ consists of two P-MOS transistors and two N-MOS transistors. The latch nodes $LA_P$, $LA_N$ of the sense amplifiers are respectively connected to Vcc and Vss through either a single driving P-MOS transistor Q10 or transistors $Q10_1$–$Q10_n$ and N-MOS transistor Q20 or transistors $Q20_1$–$Q20_n$.

Further, a P-MOS transistor Q11, of which gate and source terminals are connected to gate terminals of said driving P-MOS transistors Q10 or $Q10_1$–$Q10_n$, forms current mirror circuit together with the driving P-MOS transistor, thereby adjusting the current flow rate of the driving transistor or transistors Q10 or $Q10_1$–$Q10_n$ during the active restore operation of the sense amplifiers $SA_1$–$SA_n$.

The gate and source terminals of transistor Q11 are connected to the output terminal of an inverter circuit consisting of a P-MOS transistor Q12 and an N-MOS transistor Q13, so that the above mentioned current mirror circuit will be operationally controlled by an active restore enable signal $\phi_{SP}$. The source terminal of the N-MOS transistor Q13 is connected to an N-MOS transistor Q14 which serves as a constant current source for the current mirror circuit.

The N-MOS transistor Q14 receives a bias voltage Vbias through its gate terminal, and its source terminal is connected to a ground terminal Vss the drain terminals of the P-MOS transistors Q11, Q12 are connected to a power source terminal Vcc.

Meanwhile, the current mirror circuit requires a constant current source, and the constant current source according to the present invention is constructed such that the gate voltage Vbias of a MOS transistor Q14 has an intermediate level between Vcc and Vss, and is proportionate to Vcc.

The operation of sense amplifier driving circuit described above will now be explained.

During the active restore operations of the sense amplifiers, if a row address strobe signal RAS attains a low level so as to be in an active cycle, then an active restore enable signal $\phi_{SP}$ inputted into the inverter circuit will have a high level, and the P-MOS transistor Q12 will be turned off, and the N-MOS transistor Q13 will be turned on.

Accordingly, the output of the inverter circuit will have a low level, causing the P-MOS transistor Q11 of the current mirror circuit to be turned on. Driving transistors Q10 or $Q10_1$–$Q10_n$ are also turned on, guiding the current transistor Q11 to the constant current source Q14.

Thus, the signal $\phi LA_{PG}$ at the node $LA_{PG}$ is set to have an intermediate voltage between the high level and the low level, which is less than [Vcc-Vth], so that the driving transistors Q10 or $Q10_1$–$Q10_n$ will be slowly turned on. Vth is the threshold voltage of the driving transistor.

The driving transistors Q10 or $Q10_1$–$Q10_n$ are arranged together with the P-MOS transistor Q11 to form a current mirror circuit, so that the currents of the driving transistors Q10 or $Q10_1$–$Q10_n$ will flow at a rate proportionate to the current flow rate of P-MOS transistor Q11.

During the active restore operations, the peak current of the active restore driving signal $\phi LA_P$ corresponds the sizes of the respective transistors, and in response, the potential of the node $LA_P$ will vary linearly, so that the stability of the sense amplifiers will improve.

In a similar manner, during the sensing operation of the sense amplifiers, the current flow rate of the driving transistors is adjusted, by arranging N-MOS transistor Q15 with its gate and source terminals connected to the gate terminals of the sense amplifier driving N-MOS transistors Q20 or $Q20_1$–$Q20_n$ in such a manner that it forms a current mirror circuit together with the driving N-MOS transistors.

Further, the gate and drain terminals of the transistor Q15 are connected to the output terminal of an inverter circuit consisting of an N-MOS transistor Q16 and a P-MOS transistor Q17, in such a manner that the operations of the current mirror circuit is controlled in accordance with the sensing enable signal $\phi_{SN}$.

The drain terminal of the P-MOS transistor Q17 is connected to a P-MOS transistor Q18 which serves as a constant current source for the current mirror circuit. The gate terminal of the P-MOS transistor Q18 is set to receive a bias voltage of an intermediate level between Vcc and Vss, and the drain terminal of the transistor Q18 is set to receive an external power source terminal Vcc, while the source terminals of the N-MOS transistors Q15, Q16 are connected to a ground terminal Vss.

Figure 4:
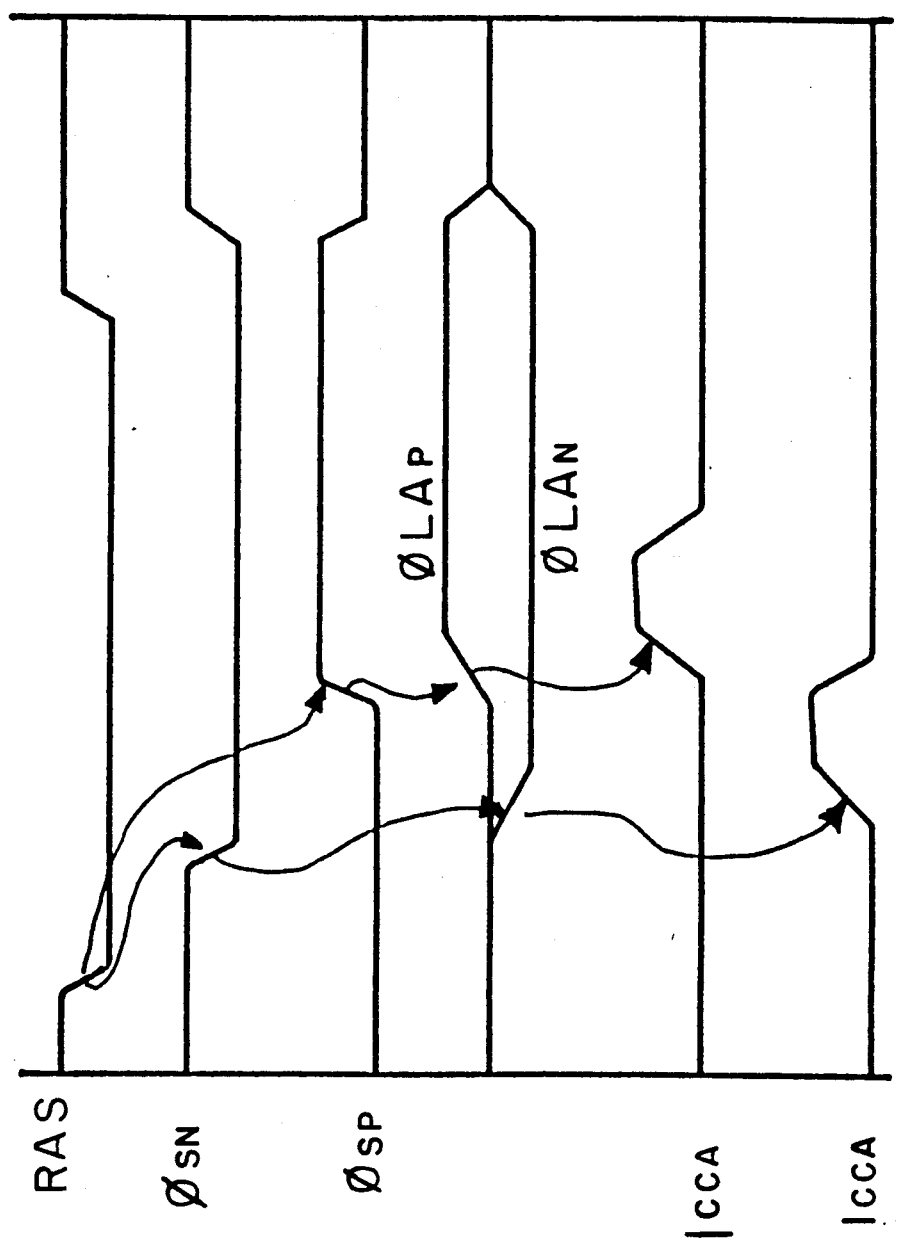
FIG. 4 is a timing chart for the driving signals generated in the sense amplifier driving circuit of FIGS. 3A and 3B.

The sensing driving operation of the circuit described above is operated in a manner as follows. As shown in FIG. 4, if the row address strobe signal RAS have a low level, indicating an active cycle, then the sensing enable signal $\phi_{SN}$ inputted into the inverter circuit will also have a low level, resulting in the N-MOS transistor Q16 turning-off, and the P-MOS transistor Q17 being turning-on. Accordingly, the output of the inverter circuit will be at a high level, so that the N-MOS transistor Q15 of the current mirror circuit will be turned on, and the driving transistors Q20 or $Q20_1$–$Q20_n$ will also be turned on.

In this way, the current of the driving transistors Q20 or $Q20_1$–$Q20n$ are set to flow at a rate proportionate to the current of the transistor Q15, so that the driving transistors will be slowly turned on.

The driving transistors Q20 or $Q20_1$–$Q20n$ are constructed in the form of a current mirror circuit together with the N-MOS transistor Q15, in such a manner that the current of the driving transistors Q20 or $Q20_1$–$Q20n$ is proportionate to the current through the N-MOS transistor Q15.

Accordingly, during the sensing, the peak current of the sensing driving signal $\phi LA_N$ is adjusted in accordance with the size ratios of the respective transistors, and the potential at the node $LA_N$ is varied in a linear form, so that the stability of the microsized high density semiconductor memory device is improved.

If the respective channel width/lengths of transistors Q10, Q10$_1$-Q10n, Q20, Q20$_1$-Q20n, Q11 and Q15, which constitute the current mirror circuit in FIGS. 3A and 3B, are denoted by W10/Lp, W10$_1$/Lp-Q10n/Lp, W20/Ln, W20$_1$/Ln-W20n/Ln, W11/Lp, and W15/Ln, and if the currents flowing through transistors Q11, Q15 during the operation of the current mirror circuit are denoted by I$_P$, I$_N$, then the currents Icca, Issa of the active restore and sensing driving signals $\phi$LA$_P$, $\phi$LA$_N$ are governed by the following formulas:

$$Icca = \frac{W10}{W11} \times I_P = \frac{W10_1 + W10_2 + W10_3 + W10n}{W11} \times I_P \quad [1]$$

$$Issa = \frac{W20}{W15} \times I_N = \frac{W20_1 + W20_2 + W20_3 + W20n}{W15} \times I_N \quad [2]$$

In Formulas [1] and [2], it can be seen that the peak currents Iccap and Issap of the active restore and sensing driving signals are determined by the size ratios of the respective transistors.

As a result, the currents of the driving transistors Q10 or Q10$_1$-Q10n, and Q20 or Q20$_1$-Q20n will flow at a rate proportionate to the current flow rates of the transistors Q11, Q15 which form the current mirror circuit.

Figure 1A:
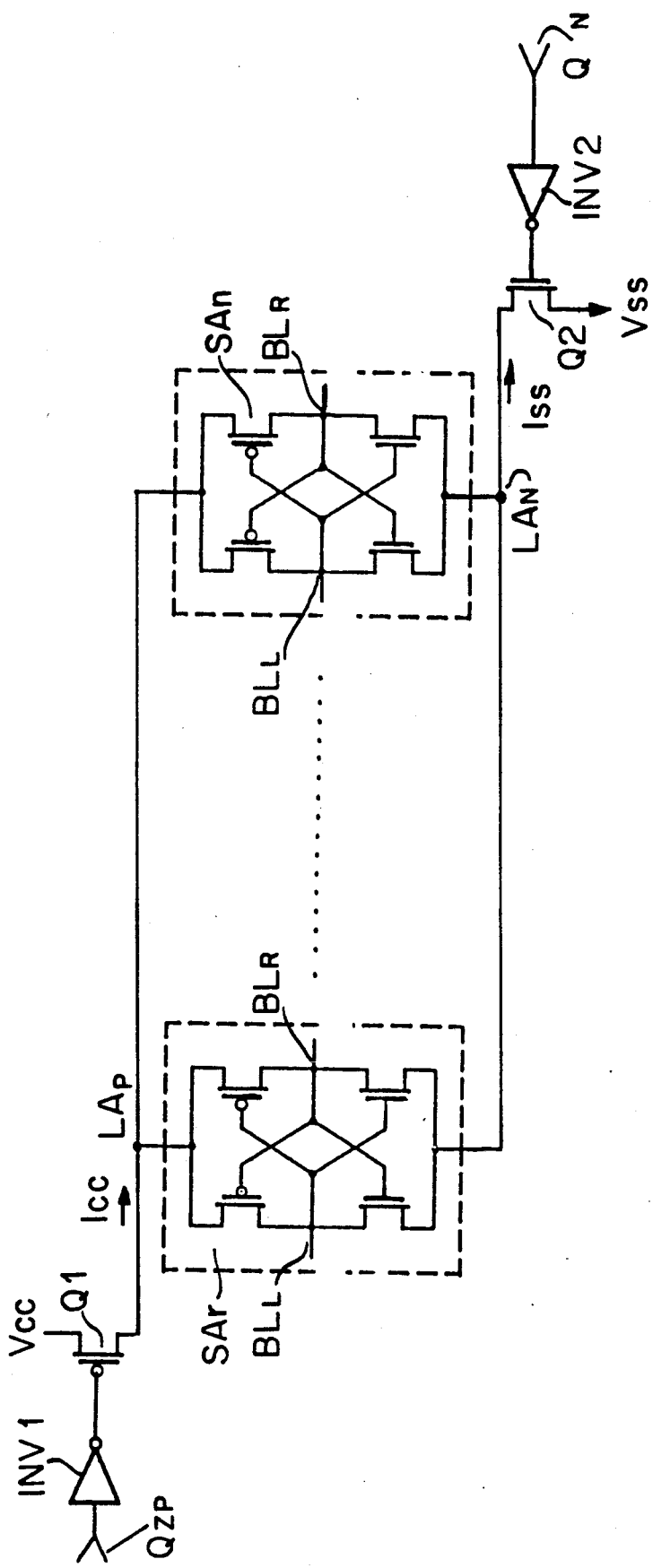
FIGS. 1A and 1B (Prior Art) are circuital illustrations of the conventional sense amplifier driving circuits.
Figure 1B:
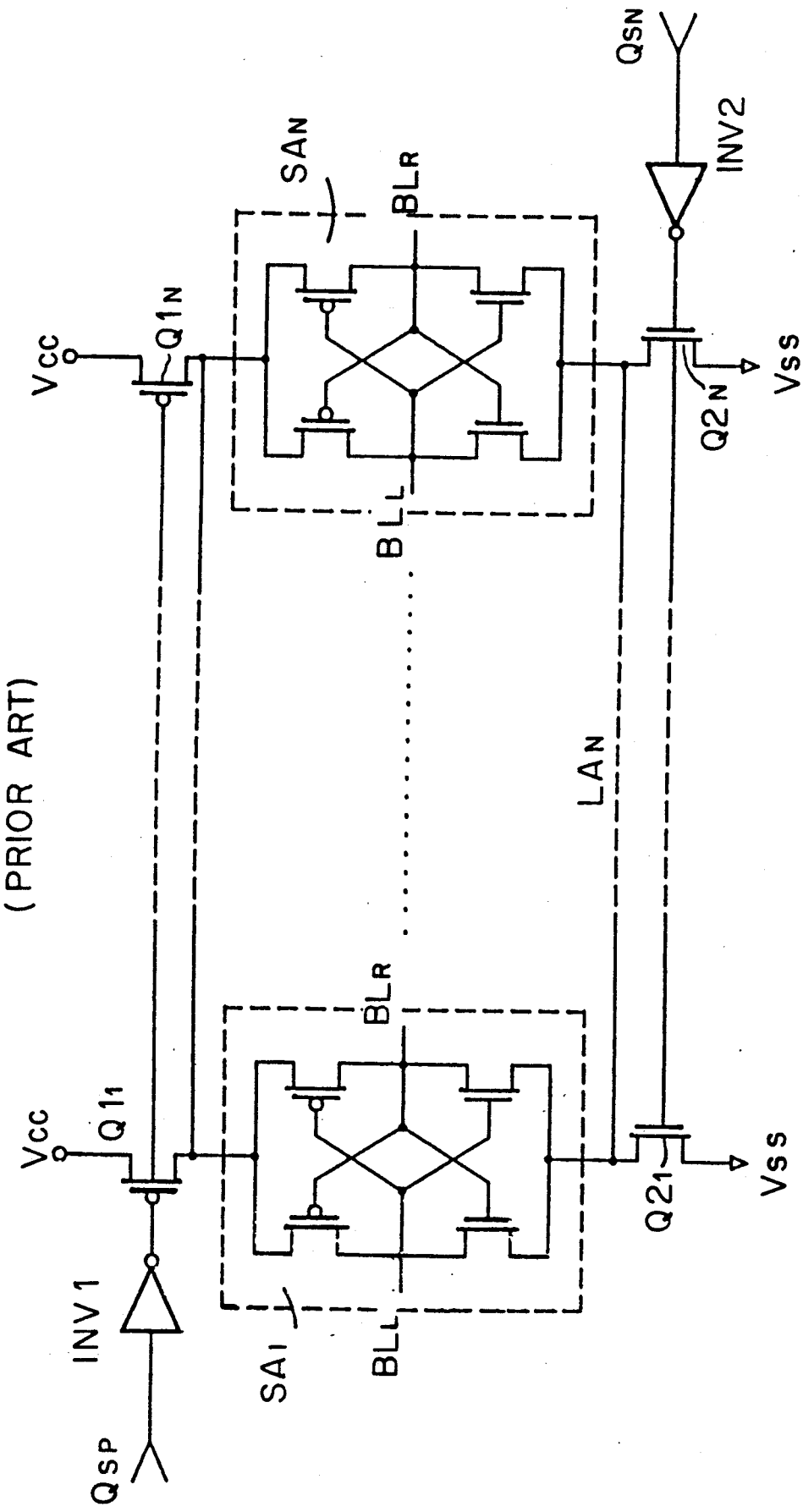
Figure 2:
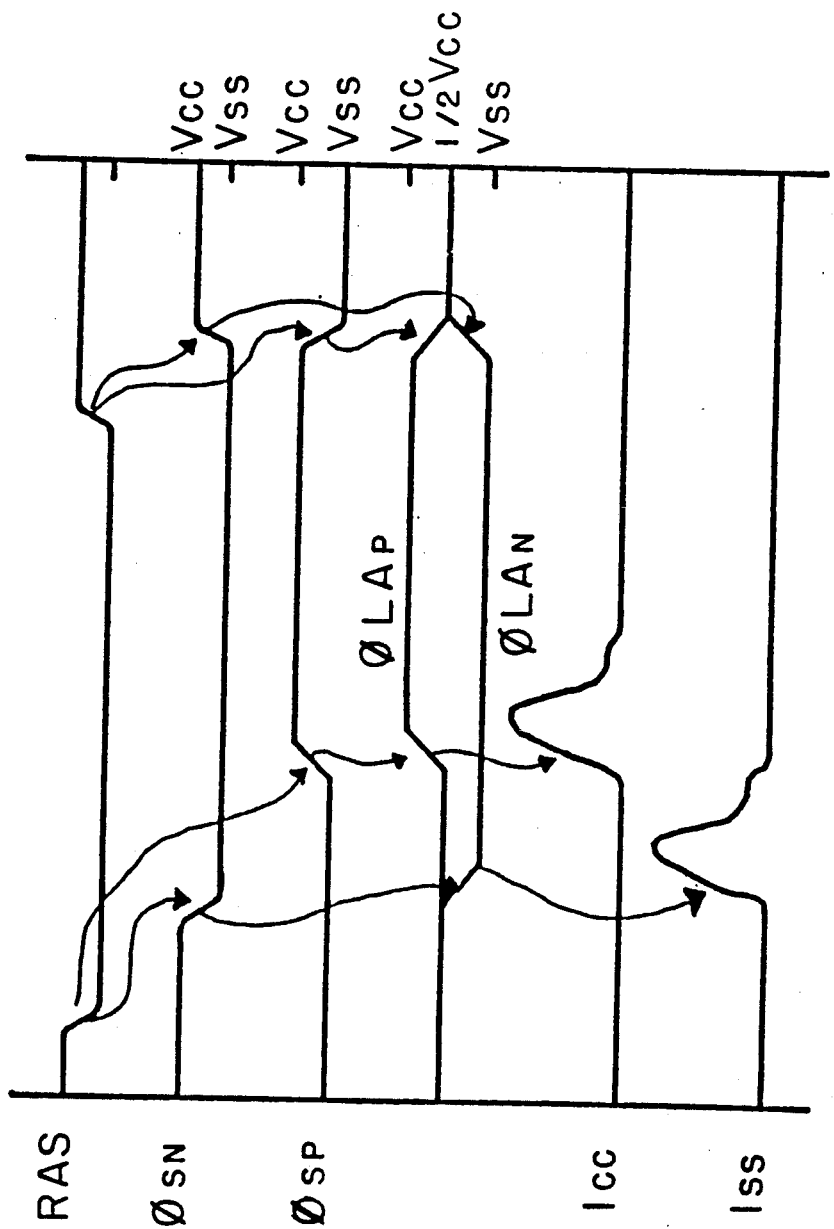
FIG. 2 (Prior Art) is a timing chart for the driving signals generated in the conventional sense amplifier driving circuits of FIGS. 1A and 1B (Prior Art)

As shown in FIG. 4, the sequence of the control clock signals for the sense amplifiers according to the sense amplifier driving circuit of the present invention is the same as the conventional one, except that the peak current of the active restore and sensing driving signals $\phi$LA$_P$, $\phi$LA$_N$ at the latch nodes are reduced to approximately one half of that for the conventional circuit as shown in FIG. 2 (Prior Art). The potentials of the active restore and sensing driving signals $\phi$LA$_P$, LA$_N$ according to the present invention varies in a linear form.

FIG. 5 to 8 are circuital illustrations and timing charts for the second embodiment of the sense amplifier driving circuit of the present invention, in which the active restore driving signals are clamped to an internal voltage level (approximately 4 V).

In a high density semiconductor memory device, it is necessary that the restore voltage for the memory cells is clamped to an internal voltage regardless of the external voltage. In order to meet this requirement, the present embodiment includes a comparator circuit consisting of a differential amplifier and a current mirror circuit.

Figure 5:
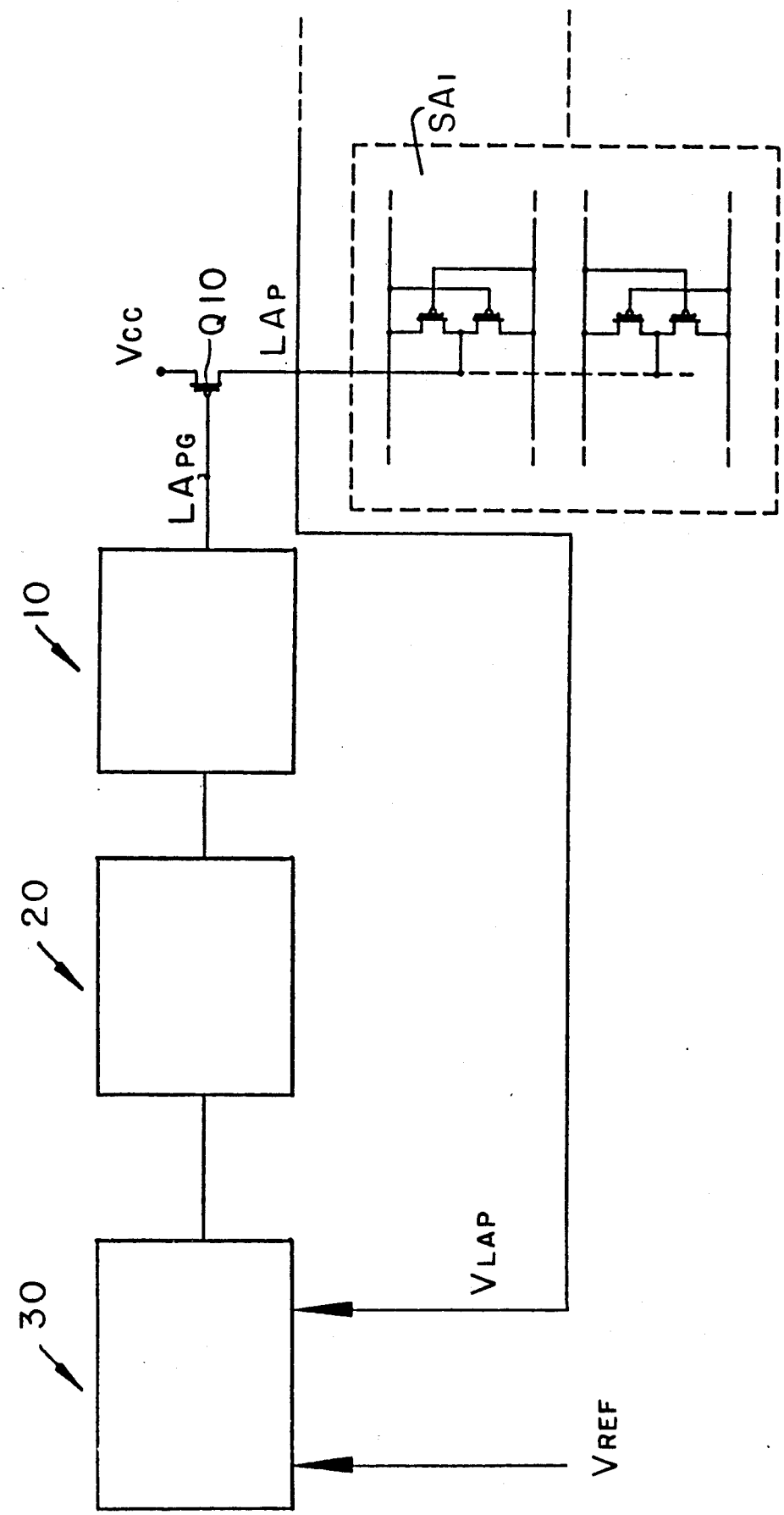
FIG. 5 is a block diagram schematically illustrating the second embodiment of the sense amplifier driving circuit of the present invention, in which the active restore driving signals are clamped.

With references to FIGS. 5 and 6, the second embodiment of the sense amplifier driving circuit according to the present invention is described below.

A plurality of P-MOS transistors of sense amplifiers SA$_1$-SA$_N$ are connected to a latch node LA$_P$, and a driving transistor Q10 is connected thereto, with the drain terminal of the driving transistor Q10 being connected to an external power source terminal Vcc.

The sense amplifier driving circuit according to the present invention further includes a bias circuit 10, a trigger circuit 20, and a comparator circuit 30.

Figure 6:
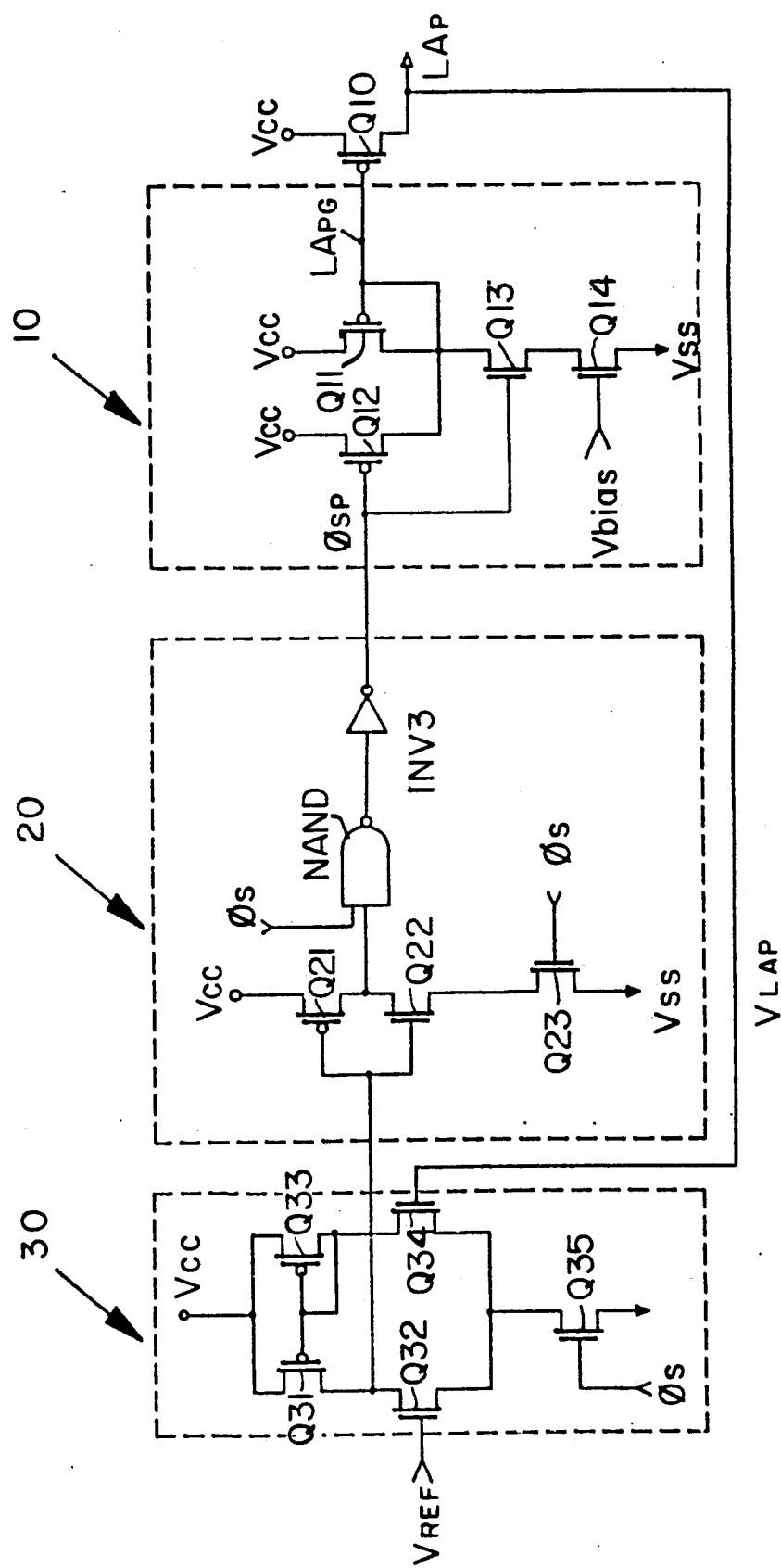
FIG. 6 is a detailed circuital illustration of the second embodiment of the sense amplifier driving circuit according to the present invention as shown in FIG. 5.

More specifically, the gate terminal of the driving transistor Q10 of FIG. 6 is connected to the bias circuit 10, in such a manner that the gate voltage of the driving transistor Q10 is controlled such that the active restore driving signal $\phi$LA$_P$ will have a linear rising slope.

The bias circuit 10 for adjusting the current flow rate of the driving transistor Q10 includes a P-MOS transistor Q11 connected to the gate terminal of the driving transistor Q10 so as to form a current mirror circuit together with driving transistor Q10. It also include an inverter circuit for controlling the operations of the current mirror circuit, consisting of a P-MOS transistor Q12 and an N-MOS transistor Q13. The inverter circuit is connected to source and gate terminals of transistor Q11. An N-MOS transistor Q14 serves as a constant current source for the current mirror circuit, and is connected to the source terminal of N-MOS transistor Q13.

The drain terminals of the transistors Q11, Q12 are connected to the external power source terminal Vcc, and the gate terminal of the transistor Q14 receives a bias voltage Vbias, while its source terminal is connected to a ground terminal Vss.

The trigger circuit 20 includes: a P-MOS transistor Q21 with its drain terminal connected to the external voltage Vcc; an N-MOS transistor Q22 with its gate and drain terminals connected respectively to the gate and source terminals of the transistor Q21; an N-MOS transistor Q23 with its drain terminal connected to the source terminal of the N-MOS transistor Q22, and with its source terminal connected to the ground terminal Vss; a NAND gate NAND with one of its input terminals connected to the source terminal of transistor Q21 and to the drain terminal of transistor Q22, and with the other input terminal receiving the enable clock signal $\phi$s; and an inverter INV3 connected to the output terminal of the NAND gate.

The comparator circuit 30, which detects the voltage V$_{LAP}$ of the latch node of the sense amplifiers and compares it with the reference voltage V$_{REF}$ and outputs the result, includes: a constant current source Q35 and a differential amplifying circuit consisting of two P-MOS transistors Q31, Q33 and two N-MOS transistors Q32, Q34. The reference voltage V$_{REF}$ is supplied to the gate terminal of the transistor Q32, while the voltage V$_{LAP}$ of the latch node is supplied to the gate terminal of the transistor Q34.

The operation of the second embodiment of the present invention will now be explained with references to the wave forms in FIG. 8.

If the enable clock signal $\phi$s for the sense amplifier driving circuit is high, then the comparator circuit 30 outputs a low level signal which is inputted to trigger circuit 20. The trigger circuit 20, in response, outputs a high level signal which is inputted into the bias circuit 10 in order to slowly turn on the driving transistor Q10 in the same manner as that described for FIG. 3A and 3B.

Under this condition, the voltage of the active restore driving signal $\phi$LA$_P$ rises linearly, and if this voltage reaches a level identical to the reference voltage V$_{REF}$, the comparator circuit 30 which consists of transistors Q31, Q33, Q32, Q34, and Q35 outputs a high level signal, and the trigger circuit 20 outputs a low level signal. This results in the active restore enable signal $\phi$$_{SP}$ being disabled, and thus the driving transistor is turned off.

In this way, the voltage of $\phi$LA$_P$ is detected through a detecting line, and the voltage of LA$_P$ and the reference voltage V$_{REF}$ are compared each other. If the voltage at node LA$_P$ is lower than the reference voltage V$_{REF}$, the active restore enable signal $\phi$$_{SP}$ is enabled, so as to slowly turn on the sense amplifier driving transistor, otherwise, the comparator circuit 30 outputs a high level signal. The trigger circuit then outputs low signal, which causes disabling of $\phi$$_{SP}$ which, in turn, causes the driving transistor to cease supplying current.

Figure 8:
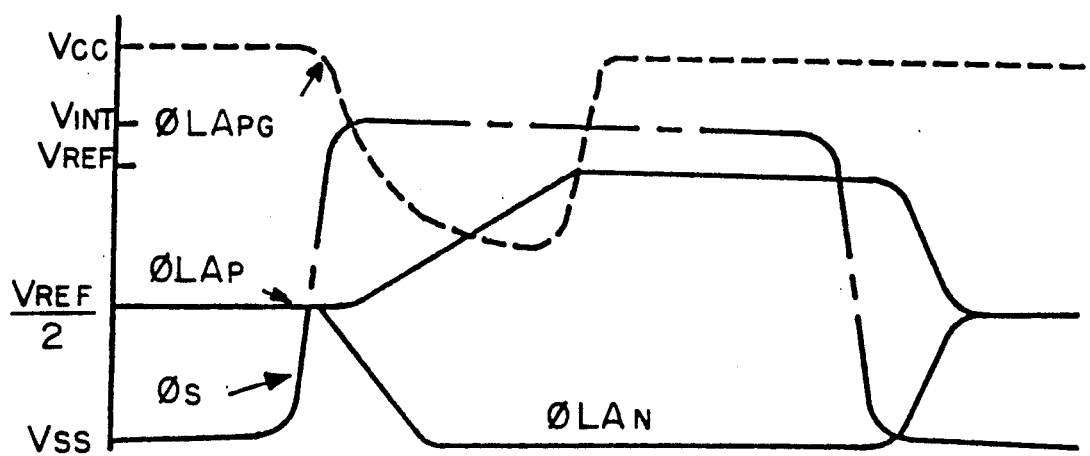
FIG. 8 is a timing chart for the driving signals generated in the second embodiment of the present invention.
Figure 8:
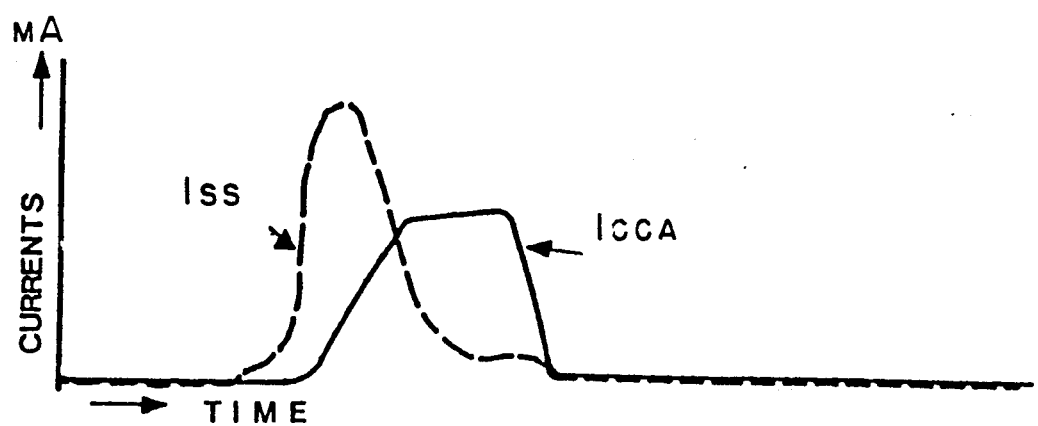

The voltage of the active restore driving signal $\phi_{LAP}$ is clamped to the internal voltage level as shown in the wave form in FIG. 8. That is, the voltage of the active restore driving signal $\phi_{LAP}$ is maintained at the level of the reference voltage $V_{REF}$.

Figure 7:
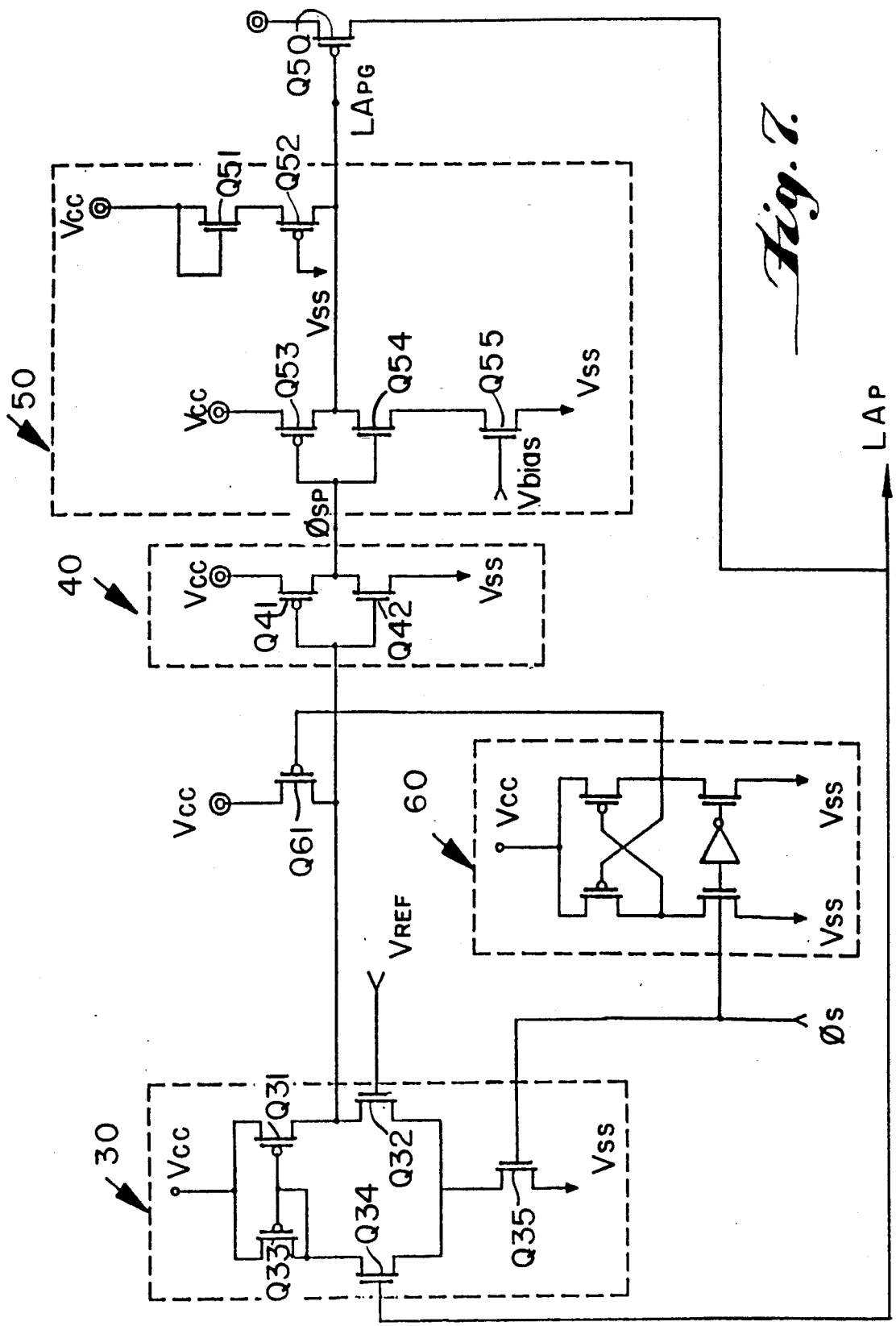
FIG. 7 is a detailed illustration of a circuit which is similar to the second embodiment circuit of FIG. 6, but in a slightly modified form.

FIG. 7 illustrates another example of sense amplifier driving circuit, and it includes a circuitry for clamping the active restore voltage. It has a slight modification to the sense amplifier driving circuit shown in FIG. 5 and 6.

The comparator circuit 30 is identical to that of FIG. 6, while the trigger circuit 40 includes an inverter consisting of two transistors Q41, Q42.

The bias circuit 50 includes two transistors Q51, Q52 which form a current source, and also includes a current mirror circuit consisting of the two transistors Q51, Q52 and the driving transistor Q50. This design is different from the circuit of FIG. 6 in which the bias circuit 10 includes a current mirror circuit consisting of the driving transistor Q10 and the transistor Q11. Except as mentioned above, all the other elements of the circuit of FIG. 7 are identical to that of FIG. 6.

The operations of the sense amplifier driving circuit of FIG. 7 is similar to that of FIG. 6. That is, if the sense amplifier driving circuit enable clock $\phi_S$ has a high level, the voltage level of this signal is identical to the internal voltage level, and this signal is pulled up to the external voltage level Vcc by the level shifter 60, so that the transistor Q61 is almost simultaneously turned off.

The sense amplifier driving circuit enable clock $\phi_S$ is inputted into transistor Q35 which forms a constant current source for the comparator circuit 30, so that the output of the comparator circuit 30 is shifted to a low level. The low level output of the comparator circuit 30 is inputted into the inverter of the trigger circuit 40 to be shifted to a high state signal which is inputted into the bias circuit 50 to trigger the bias circuit 50.

The potential of the node LA$_{PG}$ has an intermediate level as shown in FIG. 8, so that the driving transistor Q50 will slowly rise to the reference voltage $V_{REF}$. That is, the current is controlled by transistors Q51, Q52 in such a manner that constant current flows through the driving transistor Q50 for the sense amplifiers.

In this circuit as in the circuit of FIG. 3A and 3B, the constant current source is constructed such that the gate voltage Vbias of the MOS transistor Q55 has an intermediate voltage level proportionate to Vcc and between Vcc and Vss, so that constant current flows through the current mirror circuit.

In the conventional technology, it is difficult to implement dual slope type sensing and active restore operations to improve the stability of the sense amplifiers and the sensing sensitivity. Because the sense amplifiers driving transistors are disposed within the memory arrays in a spread manner, the adoption of a dual slope method becomes difficult in view of the layout of the circuitry and the chip size.

In order to overcome such a problem, the present invention employs two or more current mirror circuits in so that the respective current mirror circuits are successively activated, thereby making it possible to adopt a dual slope method.

FIGS. 9 and 10 show a circuital illustration and a timing chart for the sense amplifier driving circuit of the present invention, in which a dual slope is shown for the signal $\phi_{LAP}$ which drives the sensing and active restore operations.

In FIG. 9, a P-MOS transistor Q111 which forms a first current mirror circuit together with a driving P-MOS transistor Q110 is provided in order to adjust the current flow rate of the driving transistor Q110, and the gate and source terminals of the transistor Q111 are connected to the gate terminal of the driving transistor Q110.

The gate of P-MOS transistor Q114 is connected to the gate terminal of the driving transistor Q110 and to the gate and source terminals of the transistor Q111. The transistor Q114 forms a second current mirror circuit together with said driving transistor Q110.

A first N-MOS transistor Q112 is connected to the gate terminal of said driving transistor Q110 and to the gate and source terminals of transistor Q111 of the first current mirror circuit. A first active restore enable clock signal $\phi_{SP1}$ is supplied to the gate terminal of the transistor Q112. The source terminal of the first N-MOS transistor Q112 is connected to another N-MOS transistor Q113 which forms a constant current source, and which receives through its gate terminal a bias voltage between Vcc and Vss.

A second N-MOS transistor Q115 is connected to the gate terminal of the driving transistor and to the gate and source terminals of the transistor Q114. A second active restore enable clock signal $\phi_{SP2}$ is inputted into the gate terminal of transistor Q115. The source terminal of the second N-MOS transistor Q115 is connected to an N-MOS transistor Q116, and the gate terminal receives a bias voltage Transistor Q117 is placed between the gate terminal of the driving transistor Q110 and the gate and source terminals of the P-MOS transistor Q111. Transistor Q117's drain terminal is connected to the external power source terminal Vcc, while its the gate terminal receives a driving control clock $\phi_{EN}$ which is the output of an OR gate. The two input terminals of the OR gate respectively receive first and second active restore enable clock signals $\phi_{SP1}$, $\phi_{SP2}$.

During the active restore operations, if a row address strobe signal RAS has a low level, then the first active restore enable clock signal $\phi_{SP1}$ is set to have a high level. Accordingly, the transistor Q117 is turned off, and the transistor Q114, the transistor Q112 and the transistor Q111 of the first current mirror circuit are turned on, thereby turning on the driving transistor Q110.

Under this condition, the potential of the node LA$_p$ begins to slowly rise, and after a certain period of time, when the second active restore enable clock signal $\phi_{SP2}$ attains a high level, the transistor Q115 is turned on, so that the rate of the current flowing through the driving transistor Q110 is increased. This drives the sense amplifiers in a stable and rapid manner. The sensing driving circuit of FIG. 10, also exhibits dual slope voltage characteristic is constructed in a form similar to that of FIG. 9.

N-MOS transistor Q121 is provided in such a manner that it forms a first current mirror circuit together with the driving N-MOS transistor Q120. The current flowing through the sense amplifier driving transistor Q120 will be automatically adjusted. The gate and drain terminals of the transistor Q121 are connected to the gate terminal of the driving transistor Q120.

N-MOS transistor Q124 is provided in such a manner that it is connected to the gate terminal of the driving transistor and to the gate and drain terminals of the transistor Q121, so that transistor Q124 forms a second current mirror circuit together with the driving transistor.

Further, a source terminal of P-MOS transistor Q122 is connected to the gate terminal of the driving transistor Q120 and to the gate and drain terminals of transistor Q121, while a sensing enable clock signal $\phi_{SN1}$ is inputted into the gate terminal of transistor Q122.

P-MOS transistor Q125 is connected to the gate terminal of the driving transistor Q120 and to the gate and drain terminals of transistor Q124, while another sensing enable clock signal $\phi_{SN2}$ is inputted into the gate terminal of the transistor Q125.

The drain terminal of the second P-MOS transistor Q125 is connected to the source terminal of P-MOS transistor Q126 which receives a bias voltage at its gate. Also, the gate terminal of the driving transistor Q120 and the gate terminals and drain terminals of N-MOS transistors Q121, Q124 are connected to transistor Q127. Transistor Q127's source terminal is connected to a ground terminal Vss, and its gate terminal receives a driving control clock $\phi_{EN}$.

During the sensing operations, if the row address strobe signal RAS has a low level, the first sensing enable clock signal $\phi_{SN1}$ goes to a low level, and the driving control clock $\phi_{EN}$ also goes to a low level, so that the transistor Q127 is turned off, and the transistor Q122 is turned on.

Accordingly, high level signals are inputted into the gate terminal of the driving transistor Q120, the transistor Q124 and the transistor Q121 of the first current mirror circuit, resulting in transistors Q121, Q120 being turned-on. The potential of $\phi LA_N$ begins to fall slowly. After a certain period of time, when the second sensing enable clock signal $\phi_{SN2}$ attains a low level, the transistor Q124 is turned on, resulting in a increase in the current through the driving transistor Q120. This manner of driving makes it possible to drive the sense amplifiers in a rapid and stable manner.

If the channel widths of the transistors Q110, Q111, Q114, Q120, Q121, and Q124 which form the current mirror circuits in FIGS. 9 and 10 are denoted by W110, W111, W114, W120, W121, and W124, and if the currents flowing through the transistors Q111, Q114, Q121 and Q124 are indicated by $I_{P1}$, $I_{P2}$, $I_{N1}$, and $I_{N2}$, then the currents of the active restore driving signal and the sensing driving signal $\phi LA_P$, $\phi LA_N$ are governed by the following formulas:

$$I_{cca} = \frac{W110}{W111 + W114} \times (I_{P1} + I_{P2}) \quad [3]$$

$$I_{ssa} = \frac{W120}{W121 + W124} \times (I_{N1} + I_{N2}) \quad [4]$$

As seen in the above formulas [3] and [4], the peak current values of the driving signals generated during the active restore and sensing operations are determined by the size ratios of the transisors, and the current through the first current mirror circuit. The first current mirror circuit is activated first and is designed to be smaller than that of the second current mirror circuit which is activated later. The first and second current mirror circuits are successively activated, so that the potentials of the active restore driving signal $\phi LA_P$ and the sensing driving signal $\phi LA_N$ will have a linear dual slope, thereby making it possible to drive the sense amplifiers in a rapid and stable manner.

According to the present invention as described above, during the operation of the driving transistor for the sense amplifiers of the semiconductor memory device, the gate voltage of the driving transistor is controlled by the bias circuit which includes a MOS transistor forming a current mirror circuit together with the driving transistor. The driving transistor is slowly turned on, so that the active restore and sensing driving signals have a linear rising or falling slope. This results in the peak currents of the driving signals being reduced, thus improving the stability of the microsized sense amplifiers.

Further, the sense amplifier driving circuit is provided with two current mirror circuits which are successively activated, so that the sense amplifier driving signals are in the form of a linear dual slope.

Further, the bias circuit is provided with a clamping circuit in which a comparator circuit is included. Thus, it is possible to clamp the active restore driving signal to the internal voltage level (approximately 4 V), and prevent the distortion of the characteristics of the cell device.

Further, according to the present invention, the enabling is done only for the active restore operation, thereby providing a sense amplifier driving circuit which eliminates the additional standby current in the conventional internal voltage generating circuit.

What is claimed is:

1. A sense amplifier driving circuit for driving a plurality of sense amplifiers, comprising:
   at least one driving transistor having an output terminal connected to respective inputs of said sense amplifiers and an input terminal for receiving an external voltage Vcc;
   a bias circuit for controlling a gate voltage $V_{LAPC}$ of said at least one driving transistor in response to an active restore enable signal $\phi_{SP}$ to adjust the current supplied by said at least one driving transistor, the output of the bias circuit being connected to a gate of said at least one driving transistor;
   a comparator circuit for comparing the input voltage $V_{LAP}$ of said plurality of sense amplifiers with a reference voltage $V_{REF}$, said comparator circuit including a differential amplifier circuit and a constant current source; and
   a trigger circuit for triggering the bias circuit to a high and a low state, each state at different instances, activating and deactivating the bias circuit at different instances in response to an output from said comparator circuit, an output of the trigger circuit being connected to an input of said bias circuit and an input of the trigger circuit being connected to the output of said comparator circuit, whereby an active restore voltage at the output terminal of said driving transistor is clamped to a substantially constant voltage.

2. A sense amplifier driving circuit as in claim 1, wherein said bias circuit comprises:
   a P-MOS transistor whose gate is connected to the gate of said at least one driving transistor, the P-MOS transistor and the at least one driving transistor forming a current mirror circuit;
   an inverter circuit for controlling the operations of said current mirror circuit in response to said active restore enable signal $\phi_{SP}$ and including a P-MOS transistor and a first N-MOS transistor; and
   a second N-MOS transistor acting as a constant current source for said current mirror circuit and receiving a bias voltage through its gate terminal, a drain terminal of said second N-MOS transistor being connected to the source terminal of said N-MOS transistor of said inverter circuit and a source terminal of said second N-MOS transistor being connected to a ground terminal.

3. A sense amplifier driving circuit as in claim 2, wherein said bias voltage inputted into the gate terminal of said second N-MOS transistor is maintained at an intermediate level between said external voltage Vcc and a ground voltage Vss.

4. A sense amplifier driving circuit as in claim 2, wherein the reference voltage $V_{REF}$ and the input voltage $V_{LAP}$ of said plurality of sense amplifiers are compared to each other during active restore operations, such that when the voltage $V_{LAP}$ is equal to or larger than the reference voltage, the operation of the current mirror circuit is interupted clamping the active restore voltage to a constant level.

5. A sense amplifier driving circuit as in claim 1, wherein the gate voltage of said at least one driving transistor is shifted to an intermediate level between said external voltage Vcc and a ground voltage Vss during the driving of said sense amplifiers.

6. A sense amplifier driving circuit as in claim 1, wherein said trigger circuit comprises:
   a first P-MOS transistor having a drain terminal connected to said external voltage Vcc;
   a first N-MOS transistor having gate and drain terminals connected respectively to gate and source terminals of said first P-MOS transistor;
   a second N-MOS transistor having a drain terminal connected to a source terminal of said first N-MOS transistor and a source terminal connected to a ground voltage Vss;
   a NAND gate having a terminal connected to the source terminal of said first P-MOS transistor and to the drain terminal of said first N-MOS transistor, and another terminal receiving enable clock signals $\phi_s$ for enabling the sense amplifier driving circuit; and
   an inverter having an input connected to an output terminal of said NAND gate.

7. A sense amplifier driving circuit as in claim 1, wherein said trigger circuit includes an inverter comprising a P-MOS transistor and an N-MOS transistor.

8. A sense amplifier driving circuit as in claim 1, wherein said comparator circuit comprises:
   a differential amplifying circuit consisting of two P-MOS transistors and two N-MOS transistors; and
   a constant current source connected to source terminals of said N-MOS transistors of said differential amplifying circuit, and receiving a driving control clock $\phi_s$ through a gate terminal,
   wherein said comparator circuit compares a reference voltage $V_{REF}$ inputted into a gate terminal of one of said N-MOS transistors with the voltage $V_{LAP}$ (of a node $LA_p$) inputted into a gate terminal of the other of said N-MOS transistors, and generates said comparator circuit output in response to the comparison.

9. A circuit for driving a plurality of sense amplifiers comprising:
   active restore driver means for producing an active restore reference voltage in response to an active restore enable signal and a bias voltage, said driver means being connected to a power supply voltage, a reference ground, and said plurality of sense amplifiers and comprising:
   driving current means for supplying said active restore reference voltage to said sense amplifiers, said driving current means being controlled by a driving signal having a first value that slowly turns on said driving current means to reduce a peak current that develops when establishing said active restore reference voltage;
   first means coupled to said driving current means for controlling said driving signal in response to said active restore enable signal; and
   first constant current means for supplying a first constant current to said driving current means; and,
   sense driver means for producing a sense reference voltage in response to a sensing enable signal and said bias voltage, said sense driver means being connected to said power supply, said reference ground, and said plurality of sense amplifiers and comprising:
   sense current means for providing said sense reference voltage, said sense current means being controlled by a sense signal having a second value that slowly turns on said sense current means to reduce a peak current that develops when establishing said sense reference voltage;
   second means coupled to said sense current means for controlling said sense signal in response to said sensing enable signal; and
   second constant current means for supplying a second constant current to said sense current means.

10. A circuit according to claim 9, wherein said driving current means includes a driver transistor controlled by said driving signal and having a threshold voltage $V_{TH}$, said first value being an intermediate voltage having a valve less than said power supply voltage minus said threshold voltage $V_{TH}$.

11. A circuit according to claim 10, wherein
    said driving current means includes a second transistor configured as a current mirror with said driver transistor, both said second transistor and said driver transistor being controlled by said driving signal; and
    a channel width ratio of said driver transistor to said second transistor defines said intermediate voltage having a value less than said power supply voltage minus said threshold voltage $V_{TH}$.

12. A circuit according to claim 11, wherein said driver transistor and said second transistor are both P-MOS transistors.

13. A circuit according to claim 9, wherein said sense current means includes a sensing driver transistor controlled by said sense signal and having a threshold voltage $V_{TH}$, said second value being an intermediate voltage having a value less than said power supply voltage minus said threshold voltage $V_{TH}$.

14. A circuit according to claim 13, wherein
    said sense current means includes a second sensing transistor configured as a current mirror with said sensing driver transistor, both said second sensing transistor and said sensing driver transistor being controlled by said sense signal; and
    a channel width ratio of said sensing driver transistor to said second sensing transistor defines said intermediate voltage having a value less than said power supply voltage minus said threshold voltage $V_{TH}$.

15. A circuit according to claim 14, wherein said sensing driver transistor and said second sensing transistor are both N-MOS transistors.

16. A circuit according to claim 9 wherein said first means comprises a first inverter and said second means comprises a second inverter.

17. A circuit for driving a plurality of sense amplifiers comprising:

active restore driver means for generating an active restore reference voltage in response to first and second active restore enable signals and a bias voltage, said driver means being connected to a power supply voltage, a reference ground, and said plurality of sense amplifiers and comprising:

driving current means for supplying said active restore reference voltage to said sense amplifiers, said driving current means being controlled by a driving signal having a first value that slowly turns on said driving current means to reduce a peak current that develops when generating said active restore reference voltage;

first means coupled to said driving current means for controlling said first value of said driving signal, said first means comprising:

first driving input means for controlling said driving signal in response to the first active restore enable signal; and second driving input means for controlling said driving signal in response to the second active restore enable signal to obtain a dual voltage slope when generating said active restore reference voltage; and first constant current means for supplying a first constant current to said driving current means; and, sense driver means for generating a sense reference voltage in response to first and second sensing enable signals and said bias voltage, said sense driver means being connected to said power supply, said reference ground, and said plurality of sense amplifiers and comprising:

sense current means for providing said sense reference voltage, said sense current means being controlled by a sense signal having a second value that slowly turns on said sense current means to reduce a peak current that develops when generating said sense reference voltage;

second means coupled to said sense current means for controlling said second value of said sense signal, said second means comprising:

first sense input means for controlling said sense signal in response to the first sensing enable signal; and second sense input means for controlling said sense signal in response to the second sensing enable signal to obtain a dual voltage slope when generating said sense reference voltage; and second constant current means for supplying a second constant current to said sense current means.

* * * * *